(12) United States Patent
Harris

(10) Patent No.: US 7,751,183 B2
(45) Date of Patent: Jul. 6, 2010

(54) USB STACKING DEVICES AND APPLICATIONS

(75) Inventor: Scott C Harris, Rancho Santa Fe, CA (US)

(73) Assignee: Harris Technology, LLC, Rancho Sante Fe, CA (US)

( * ) Notice: Subject to any disclaimer, the term of this patent is extended or adjusted under 35 U.S.C. 154(b) by 123 days.

(21) Appl. No.: 11/956,337

(22) Filed: Dec. 14, 2007

(65) Prior Publication Data
US 2009/0158446 A1 Jun. 18, 2009

(51) Int. Cl.
G06F 1/16 (2006.01)

(52) U.S. Cl. .................................. 361/679.41

(58) Field of Classification Search ............... 361/679.4, 361/679.41
See application file for complete search history.

(56) References Cited

U.S. PATENT DOCUMENTS

| | | | | |
|---|---|---|---|---|
| 5,139,439 A * | 8/1992 | Shie | 439/359 |
| 5,640,302 A * | 6/1997 | Kikinis | 361/679.41 |
| 5,949,643 A * | 9/1999 | Batio | 361/679.27 |
| 6,035,214 A * | 3/2000 | Henderson | 455/556.1 |
| 6,049,450 A * | 4/2000 | Cho et al. | 361/679.27 |
| 6,064,566 A * | 5/2000 | Agata et al. | 361/679.4 |
| 6,178,087 B1 * | 1/2001 | Cho et al. | 361/679.23 |
| 6,219,227 B1 * | 4/2001 | Trane | 361/679.27 |
| 6,466,434 B1 * | 10/2002 | Tsai | 361/679.33 |
| 6,525,932 B1 * | 2/2003 | Ohnishi et al. | 361/679.41 |
| 6,905,374 B2 * | 6/2005 | Milan | 439/752.5 |
| 7,134,016 B1 * | 11/2006 | Harris | 713/168 |
| 7,145,767 B2 * | 12/2006 | Mache et al. | 361/679.21 |
| 2005/0185364 A1 * | 8/2005 | Bell et al. | 361/679 |
| 2008/0204992 A1 * | 8/2008 | Swenson et al. | 361/684 |

* cited by examiner

*Primary Examiner*—Lisa Lea-Edmonds
(74) *Attorney, Agent, or Firm*—The Law Office of Scott C. Harris, Inc.

(57) ABSTRACT

A modular device formed with USB connectors. The USB can be used for connecting different kinds of devices, for example memories, user interfaces and the like. The USB devices can be piggybacked. In an embodiment, the USB devices can be located in a cavity formed inside the computer. Another embodiment forms a modular cellular telephone.

14 Claims, 2 Drawing Sheets

USB STACKING DEVICES AND APPLICATIONS

BACKGROUND

Removable electronics such as memory devices are commonly used as part of an electronic device. For example, devices such as computers, cameras, and other devices often use removable memory cards. The memory cards may be in different formats.

USB memory cards are known which include nonvolatile solid-state memory therein. However, other forms of memories may include different form factors, connector styles etc, making those other memories in essence incompatible with USB devices.

For example, Sony markets a memory that they call the memory stick. Other companies use SD memory, Compact Flash memory or others. In many cases, a smart card is also a form of memory that stores a memory therein. Some removable devices, such as smart cards or USB devices, in fact use a processor as part of the device.

When the removable device is put into a slot in the device, it fills the slot. Moreover, when you have a device that requires one kind of memory, you must buy that kind of memory to use in the device. However, USB memory has become ubiquitous since virtually all computers come with a USB slot. The USB memory is often intended to be removable and transportable.

SUMMARY

The present application describes an improved packaging and architecture for a USB memory device.

One embodiment discloses a stackable USB device that can be placed into an indented part within a computer system so that at least part of the device is maintained within the housing, e.g., 80% or more.

Another aspect describes that the USB device or similar device plugs into a port, but also has a piggyback port connector. That connector may be the same sex and format that it plugs into. This allows multiple devices to be plugged in to the single port. For example, a hub/extender may be used for this purpose.

Another embodiment describes a USB device that forms a modular part of a cellular telephone.

Yet another aspect describes the use of a USB device as a semipermanently installed memory within a device of a type that conventionally includes such memory.

DETAILED DESCRIPTION

Figure 1:
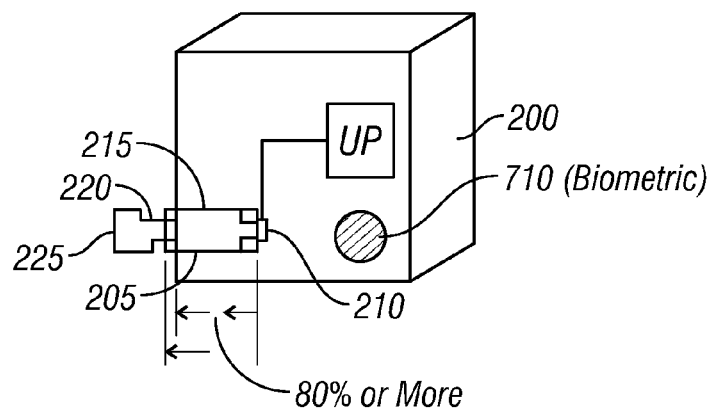
FIG. 1 shows an embodiment with a USB stick installed within a computer housing.

FIG. 1 illustrates an embodiment in which a computer system, which can be a personal computer, or a portable computer device such as a camera includes an indented port portion forming a cavity 205 with inner surfaces therein. In this embodiment, the cavity portion 205 includes a USB connection 210 at the bottom portion of the cavity. A USB device 215 fits in the cavity and connects to the USB connection 210.

The USB device 215 also includes a piggyback port 220 which can plug into another USB memory device 225. The piggyback port may be the opposite sex connector from the connector on the first side, and may be the same sex as the connector 210 at the bottom portion of the cavity.

In an embodiment, the outer dimensions of the USB device 215 are sized relative to the inner surfaces of the cavity to fit snugly within the inner dimensions of the cavity 205.

Preferably the USB device 215 includes an elastomeric or other soft and deformable exterior, that allows it to fit snugly into the cavity 205. For example, the elastomeric exterior may be compressed slightly, e.g., by 0.5 cm, to frictionally hold the device within the cavity.

Figure 2:
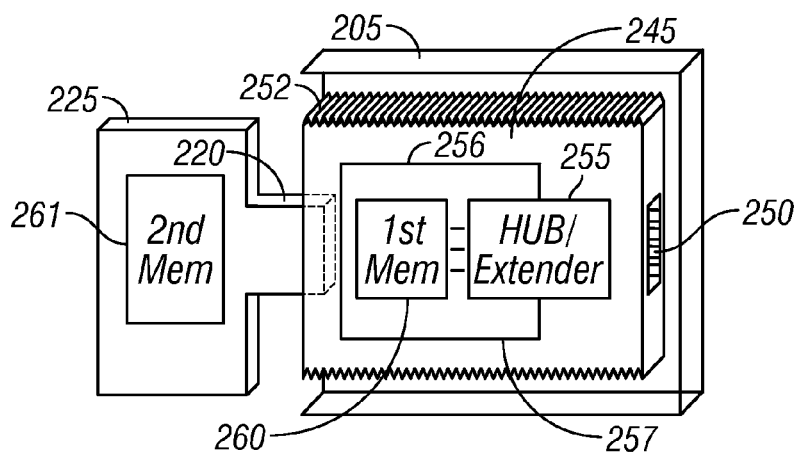
FIG. 2 illustrates a schematic view of an exemplary memory device.

FIG. 2 illustrates a schematic view of the devices, e.g, memories 215, 225. Device 215 includes a USB connector 250 that connects to the corresponding USB connector in the computer 200. The device 215 also includes a housing with outer surfaces shown as 252 which are formed of corrugated elastomeric material. These surfaces are sized to have alternate portions—some that press against the inner surface of the cavity 205 and other portions that do not press against the inner surface of the cavity 205. The power and signal from the USB connector 250 is connected to a USB hub and extender 255 that produces additional USB outputs. It also provides power on the lines 256, 257. These power output and signal lines are coupled to the piggyback connector 220. The second device 225 is shown connected to the piggyback connector 220. In This embodiment, the piggyback connector may be the same type and sex as the connector 250, within the cavity 205, and to which the device connects.

The second device 225 may also have a hub and/or extender, or may simply include a memory connected to the USB. The first device 215 includes a first electronic part 260 therein. The second device 225 includes a second electronic part 261 therein. The second device may have a memory size and type that is different than the memory in the first device. In one embodiment, the first electronic part 260 is a smart card or identification or encryption device, that is usable to read or decode or take some other action on the second device 261. The smart card in one unit, therefore, can decrypt information in the other unit.

This also facilitates use of multiple memories or multiple units connected to a single port. In addition, since smaller memory chips are often less expensive than the larger memory chips, it may often be more economically feasible to use two small chips instead of one large chip. The piggyback arrangement allows multiple connections to a single USB port by "stacking" the USB devices.

This embodiment also provides the additional advantage that a device once inserted no longer substantially extends beyond the outer form factor of the computer, e.g., where 80% of the length of the length of the inserted device is inside the cavity within the computer. This may provide a more attractive form factor, and better protection against unintentional damage to the device, for example.

Figure 3:
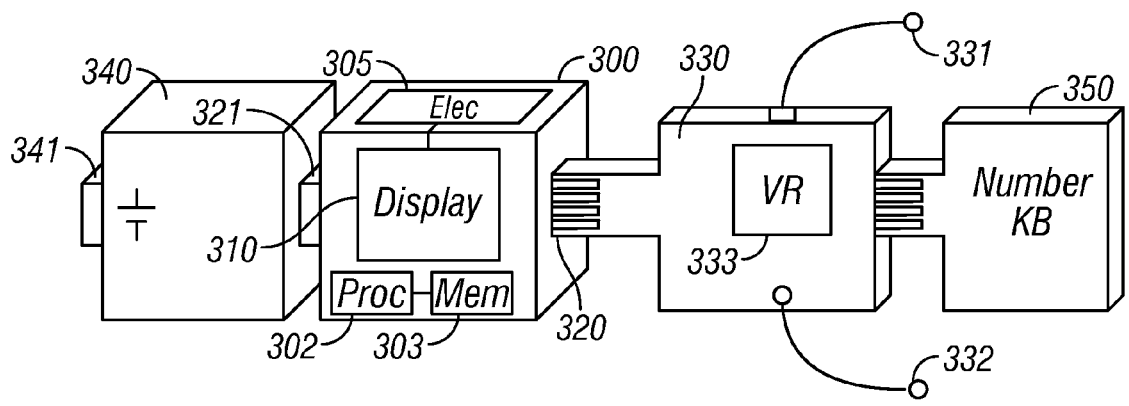
FIG. 3 illustrates a modular cellular telephone embodiment.

Another embodiment, illustrated in FIG. 3, uses a stackable USB device to form a modular, portable communication device such as a cellular telephone. In this embodiment, the stackable USB device is itself modular because the connections may connect to many different peripherals that are usable with the basic phone system.

A basic device includes a phone module 300 which includes telephone electronics module 305, connected to a peripheral device here a display 310. The device 300 may include at least one clear portion of housing so that the display 310 can be seen through the clear housing. The telephone electronics may include a conventional CMDA and/or GSM transceiver, and other electronics found in a portable telephone, including a processor 302 with memory 303 that stores information for the operation of the portable phone.

The processor 302 and memory 303 may store information defining a plug and play environment, e.g., information about how to communicate with different peripherals. This allows automatic recognition of different attached peripherals, as described herein.

The package 300 includes two different USB connections, here both female USB connections 320, 321. In this embodiment, all the modules have male connections to connect with the connections 320, 321, and either of the connections may receive any of a number of different modules.

A communication module 330 includes an earpiece 331 and a microphone 332. The module 330 may also include a voice recognition module 333 to enable voice enabled dialing. This device is connected to the USB port to communicate to the telephone electronics 305, to enable dialing and communication using this module 330. Operations are mirror on the display 310.

Different modules are described herein. Module 340 may include a battery that powers the telephone module 300. This is connected to the USB connector 320 on the telephone package 300, but can alternatively be connected to the other connector 320.

In an embodiment, the telephone can thus be formed using connectable and interchangeable parts. The batteries such as 340 use standard connectors (here USB), and can be interchanged. In addition, other devices can be piggybacked on the modules—for example, battery 340 is shown with a piggyback connector 341 that allows connection of any other module to the piggyback connection.

The embodiment shows a handset/earpiece/mouthpiece unit 330; however it should be understood that other modular devices such as a numeric keyboard, or a Bluetooth or other wireless module such as Wifi or Wimax, or hotspot adapter can alternatively be attached.

This also enables a new way of connecting to public or private networks such as hotspots. Currently, one must log in to the hotspot, and follow login and payment procedures that allow use of the hotspot. This can sometimes be difficult and time consuming, especially for inexperienced users. This may serve as a deterrent to using the pay internet area. One of the deterrents is because of the time necessary to access the area. For example, a user who has only 30 minutes to use in internet access will not find it feasible to spend 10 of those minutes connecting to the pay internet site.

This embodiment allows a prepaid hotspot adapter to be sold, e.g. with an hour of hotspot time on it, and preconfigured for use with the specific hotspot provider, e.g, having a smartcard therein with identification information that allows access of the area. This may include communication chips for use with the hotspot provider, for example, or just communication parameters for use with the hotspot provider. The units may be returnable and/or rechargeable so that the reusable parts of the chips can be re-used. In one embodiment, the USB device can be connected to the internet, or to a kiosk to recharge the chips. Alternatively, the device can just be exchanged for another device.

Importantly, all parameters needed to log in to the pay internet area are all programmed into the device so that the user does not need to carry out difficult and time consuming steps to log in to the pay area.

An advantage of this system is completely unexpected. This enables using a completely configurable and modular portable device such as a telephone. The telephone uses standard connectors, here USB connectors, to allow different peripherals to be connected. The attached parts may be plug and play so that new parts can be added and automatically configured for use with the portable telephone. The telephone may automatically recognize new parts, and communicate therewith using information from the plug and play information stored in memory 303. Also, the plug and play in memory 303 may be automatically updated when the phone module 300 is connected to the communication network.

This also enables the user to take the basic communication part of the telephone 300, and configure it to include only those parts they believe they will need. They can use a battery module 340, or alternatively could connect the communication part directly to AC power. They can use a keyboard, or use some other kind of user interface such as a voice recognition module. This can also be connected to enable various kinds of communication, for example other modules could include television modules, Internet modules, or the like.

Different sizes of batteries could be used. Take the example, therefore, where a user can decides to go to the grocery store. They may need a telephone to take with them, but desire only very limited functionality. Therefore, the user could connect a small battery, and the limited functionality unit 330, allowing them to carry a small sized device. Alternatively, if they need to make calls, in addition to or in place of the limited functionality device 330, they may configure the device to include a module 350 that has a numeric and/or alphanumeric keyboard 350. They may also install a larger battery or piggyback another battery on to the expansion slot 341. In addition, a Bluetooth module can be installed, in which case no earpiece, mouthpiece is necessary at all. The user can reconfigure the modules and parts as desired to provide a phone having the desired characteristics. A user can decide which modules to install, depending on their desired use.

Figure 4:
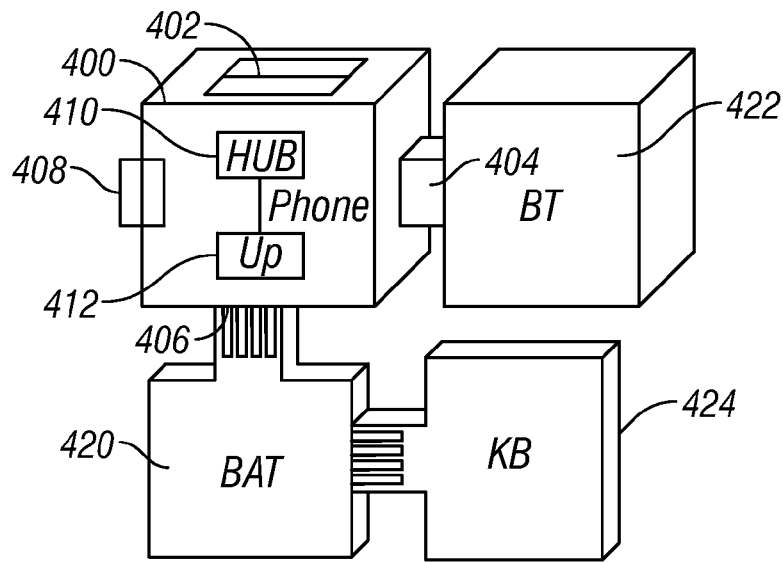
FIG. 4 illustrates an embodiment that can be reconnected in two directions.

FIG. 4 shows an alternative embodiment in which the device is configured in a way that allows each of the different modules to be connected in two different dimensions/directions. In this embodiment, the phone module 400 includes connections on four different sides shown as 402, 404, 406 and 408. Each of these can be USB connections, and can be powered by an internal hub 410 that connects to the phone microprocessor 412. The devices can be connected in two different directions, for example a battery 420 is shown connected to the bottom of the module 400, a Bluetooth module 422 is shown connected to the side of the module, and a keyboard 424 shown piggybacked on the battery module.

Moreover, the battery or other module can be installed within a cavity within the basic telephone device 300, as in the first embodiment, so that parts do not stick out of the device or only stick out by less than 20%.

In a two dimensional version, therefore, 4 different spots for external connections can be connected to the basic phone unit. The units can be piggybacked, so allow other devices to be added.

Figure 5:
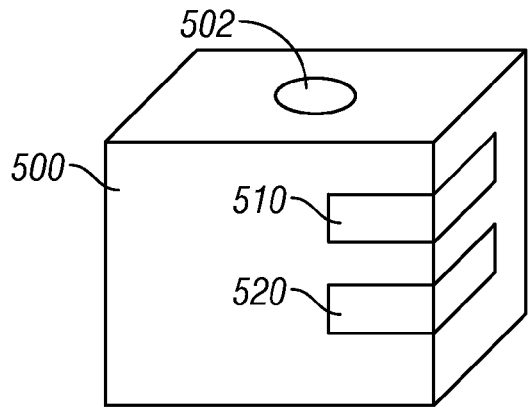
FIG. 5 illustrates embodiments used in a portable device such as a camera.

Another embodiment shown with respect to FIG. 5 uses a USB type device in a camera or telephone which previously has required proprietary memory formats such as SD memory. For example, in this embodiment, there may be two indented cavity portions that are similar to the cavity portions shown in FIG. 1. The device 500 is shown as a camera with a lens 502, however it should be understood that this can be any portable device that requires memory. In the embodiment, the first cavity 510 receives a first part that may be a USB memory. The second cavity 520 receives the second part that may be a battery. Both the memory and the battery have at least one aspect of the same form factor, for example the same width, that allows many different devices of this same form factor to fit within the cavity.

Figure 6:
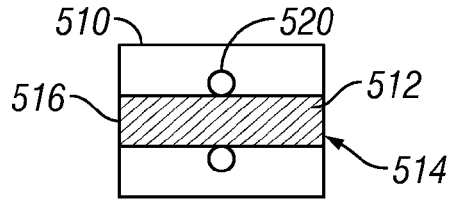
FIG. 6 illustrates tool removal.

In FIG. 5, for example, the cavity shown as 510 may have a device such as 512 that presses against the sides 514, 516, to hold the device in place. The cavity is sized to press against outer surfaces of a USB device. In addition, FIG. 6 shows how the electronic device may have a spot for example for tools such as 520, which enables tools to be attached to the device to remove the device if it is too snugly inserted.

Figure 7:
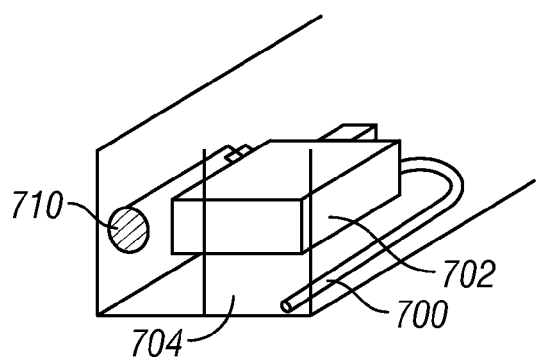
FIG. 7 illustrates lever based removal.

Another embodiment, shown in FIG. 7 uses a release mechanism shown as 700, where the release mechanism pushrod can mechanically push the electronic device 702 out of its cavity 704. Another embodiment may use an electromechanical actuator to push the device 702 out of the slot, and may lock the device 702 into the cavity 700 at other times. In another embodiment, a biometic reader 710 may be provided to read a biometric identification from a user. If the read biometric matches with a stored biometric, then the device is extracted. Otherwise, the device 702 remains locked into place. This allows a user to insert their device that may have personal information, and be assured that no one will steal it, since the code is required to access the device.

The above has described use with USB style memories. While this may be considered a preferred embodiment, it should be understood that other kinds of universal connectors can be used, for example FireWire connectors, or any other form. The memories use may be USB 1, USB 2, or USB 3, or any future generation of USB. It is preferred that the cards be ubiquitous and of a form factor that is available on most PCs, to enable ready acceptance.

Although only a few embodiments have been disclosed in detail above, other embodiments are possible and the inventor intends these to be encompassed within this specification. The specification describes specific examples to accomplish a more general goal that may be accomplished in another way. This disclosure is intended to be exemplary, and the claims are intended to cover any modification or alternative which might be predictable to a person having ordinary skill in the art. For example, other case sizes and shapes are intended to be encompassed. Other kinds of communicators beyond cell phones and blackberry type devices are contemplated.

Also, the inventor intends that only those claims which use the words "means for" are intended to be interpreted under 35 USC 112, sixth paragraph. Moreover, no limitations from the specification are intended to be read into any claims, unless those limitations are expressly included in the claims. The communicator described herein may include any kind of computer, either general purpose, or some specific purpose computer such as a workstation. The computer may be an Intel (e.g., Pentium or Core 2 duo) or AMD based computer, running Windows XP or Linux, or may be a Macintosh computer.

The programs may be written in C or Python, or Java, Brew or any other programming language. The programs may be resident on a storage medium, e.g., magnetic or optical, e.g. the computer hard drive, a removable disk or media such as a memory stick or SD media, wired or wireless network based or Bluetooth based Network Attached Storage (NAS), or other removable medium or other removable medium. The programs may also be run over a network, for example, with a server or other machine sending signals to the local machine, which allows the local machine to carry out the operations described herein.

Where a specific numerical value is mentioned herein, it should be considered that the value may be increased or decreased by 20%, while still staying within the teachings of the present application, unless some different range is specifically mentioned. Where a specified logical sense is used, the opposite logical sense is also intended to be encompassed.

What is claimed is:

1. An electronic device, comprising:
   a housing having a plurality of outer side surfaces, having a first USB connector on one of said outer side surfaces of the housing, and having another USB connector on an other of said outer side surfaces, and also having at least one electronic component within the housing, said at least one electronic component connecting to and communicating with at least one of said USB connectors, wherein said housing defines a portable device with a first connector facing in a first direction, and said second connector facing in a second direction which is along a same axis as the first connector and co-linear with said first connector, and wherein said first connector is constructed to be connected to a USB connection to a computer, and said second connector is constructed to be connected to a USB connection for another device to said computer; and
   a USB hub electronic device, allowing information received from the first USB connector to be electrically connected to the second USB connector.

2. A device as in claim 1 wherein said electronic component is a portable memory.

3. A device as in claim 1, wherein said housing includes a component allowing transceiving communication over a cellular phone.

4. A device as in claim 1, wherein said housing also includes USB connectors on second and third side surfaces thereof, which are different surfaces than said one side surface and said other side surface, thereby providing USB connectors that face in four orthogonal directions on outer side surfaces of the housing.

5. An electronic device, comprising:
   a housing having a plurality of outer side surfaces, having a first USB connector on one of said outer side surfaces of the housing, and having another USB connector on an other of said outer side surfaces, and also having at least one electronic component within the housing, said at least one electronic component connecting to and communicating with at least one of said USB connectors; and
   a USB hub electronic device, allowing information received from the first USB connector to be electrically connected to the second USB connector, wherein one of said USB connectors is a male USB connector and the other of said USB connectors is a female USB connector.

6. A computer comprising:
   a processing element; and
   a housing, housing said processing element, said housing including a USB connection, and a locking mechanism for said USB connection, said locking mechanism locking a USB device within said cavity, and allowing said USB device to be detached from said housing responsive to an unlocking indication, wherein said USB connection faces in a first direction, and further comprising a second USB connector facing in a second direction which is along a same axis as the first connection and co-linear with said first connection, and wherein said first connection is constructed to be connected to a USB for a computer, and said second connector is constructed to be connected to a USB connection for another device to said computer.

7. A computer as in claim 6, wherein said USB connection is inside a cavity within said housing, and said cavity is sized to receive at least 80% of a length of a USB device within said cavity.

8. A computer as in claim 6, wherein said housing has two of said cavities.

9. A computer as in claim 6, further comprising a biometric device, determining biometric information, and unlocking said locking mechanism to allow said USB device to be detached from said housing only when said biometric information matches a specified criteria, and otherwise maintaining said USB device as attached to said housing.

10. A computer as in claim 7, further comprising a biometric device, determining biometric information, and unlocking said locking mechanism to allow said USB device to be removed from said cavity within said housing only when said biometric information matches a specified criteria, and otherwise maintaining said USB device as attached within said cavity.

11. A computer as in claim 6, wherein said locking mechanism is mechanical.

12. A computer as in claim 6, wherein said locking mechanism is electrically actuated.

13. A device as in claim 5, wherein said first connector is constructed to be connected to a USB for a computer, and said second connector is constructed to be connected to a USB connection for another device to said computer.

14. A device as in claim 13, wherein said housing defines a portable device with a first connector facing in a first direction, and said first connector facing in a second direction which is along a same axis as the first connector and co-linear with said first connector.

* * * * *